United States Patent [19]

Shimizu

[11] Patent Number: 5,590,081
[45] Date of Patent: Dec. 31, 1996

[54] SEMICONDUCTOR MEMORY DEVICE

[75] Inventor: Tamio Shimizu, Tokyo, Japan

[73] Assignee: NEC Corporation, Tokyo, Japan

[21] Appl. No.: 546,982

[22] Filed: Oct. 23, 1995

[30] Foreign Application Priority Data

Oct. 24, 1994 [JP] Japan ................................. 6-257813

[51] Int. Cl.$^6$ ........................................... G11C 8/00
[52] U.S. Cl. ........................ 365/203; 365/222; 365/49
[58] Field of Search .................................. 365/203, 222,
365/49, 205, 208

[56] References Cited

U.S. PATENT DOCUMENTS 5,301,162  4/1994  Shimizu ............................. 365/230.03
5,488,584  1/1996  Vo et al. ................................. 365/203
5,528,552  6/1996  Kamisaki ......................... 365/230.03

*Primary Examiner*—David C. Nelms
*Assistant Examiner*—Vu A. Le
*Attorney, Agent, or Firm*—Foley & Lardner

[57] ABSTRACT

A dynamic semiconductor memory device includes a timing signal generator for controlling a precharge operation such that the predetermined precharge operation is completed, during a memory refresh cycle, for a sense amplifier and bit lines corresponding thereto for the next memory access. The memory device using the sense amplifier as cache keeping means is capable of increasing the memory access speed immediately after a memory refresh operation.

2 Claims, 5 Drawing Sheets

SEMICONDUCTOR MEMORY DEVICE

BACKGROUND OF THE INVENTION

The present invention relates to a semiconductor memory device and, in particular, to a semiconductor memory device including cache keeping means for temporarily keeping therein data in the row unit.

DESCRIPTION OF THE RELATED ART

In a semiconductor memory device of this type, in order to achieve a high-speed access to a low-speed, large-capacity dynamic random access memory (DRAM) utilized as a main memory, there is provided a buffer memory, namely, a cache memory including a high-speed, small-capacity register or a bipolar RAM to temporarily keep therein row-unit data of the DRAM. Moreover, the memory device may be configured without using such an expensive cache memory. That is, for the cache memory, there is employed in some semiconductor memory devices simple substitutive means using the data keeping operation of a sense amplifier in a high-speed access mechanism such as a page mode or a static column mode of the DRAM. In the following description, the cache memory and the sense amplifier as the substitute means thereof will be called cache keeping means.

Data (cache data) which is likely to be necessary for a central processing unit (CPU) of the memory device is copied from the main memory onto the cache keeping means in the row-address unit. Thereafter, when the CPU attempts an access to the memory, if the data in the cache memory matches that stored in an address of the memory access, i.e., if there occurs a cache hit, the CPU acquires the cache data in an access time of the high-speed cache keeping means. On the other hand, when the cache data mismatches the data in the memory, namely, when a cache miss takes place, the CPU obtains the data from the main memory in an ordinary memory access cycle. Therefore, the data can be accessed at a higher speed at occurrence of the cache hit when compared with the case of the cache miss.

In a semiconductor memory device adopting a sense amplifier as the cache keeping means, data of memory cells corresponding to a specified row address is amplified to be kept as cache data in the operation of the sense amplifier. When a mismatch condition takes place for the row address corresponding to the cache data, namely, when a cache miss occurs, the sense amplifier and the associated bit line are set to a precharge state and then data of memory cells at the new row address is sensed and amplified to be kept as new cache data.

Referring to FIG. 1 showing in a block diagram a conventional semiconductor memory device of this kind, the memory device includes a memory cell array 1 in which memory cells are disposed in a matrix shape including rows and columns, a sense amplifier 2 for amplifying and keeping therein data of a selected memory cell, a row decoder 3 for decoding an X address and generating a work line selection signal corresponding to the address, a column decoder 4 for decoding an Y address, a column control circuit 5 for controlling a column decoder 4 and an input/output circuit 6 in response to an inverted signal of the column control signal $\overline{C}$ (to be referred to as bar C herebelow) controlling selection of a column address and input and output operations of data DQ, an input/output circuit 6 for conducting input and output control operations of data DQ for the sense amplifier 2, and a row control circuit 7 for controlling the row decoder 3 and sense amplifier 2 in response to an inverted control signal $\overline{R}$ for selection of a row address and activation of the sense amplifier 2 and the inverted column control signal $\overline{C}$.

The row controller 7 includes a timing signal generator 71 for generating siganls φp and φa.

Referring to FIG. 2 showing in a circuit diagram the known typical configuratiaon of the sense amplifier 2 and a memory cell of the memory cell array 1, the sense amplifier 2 includes p-channel transistors Q1 and Q3 and n-channel transistors Q2 and Q4 to Q7. The transistors Q1 and Q2 include sources respectively connected to signal lines φA1 and $\overline{\phi A1}$ respectively related to complementary signals φa1 and $\overline{\phi a1}$. Gates and drains respectively of the transistors Q1 and Q2 are commonly connected to each other in a respective manner. The gates and drains of these transistors are linked with complementary bit lines B and $\overline{B}$, respectively. The transistors Q3 and Q4 have sources connected respectively to complementary signal lines φA1 and $\overline{\phi A1}$. The gates and drains thereof are commonly connected to each other in a respective fashion to be linked with complementary bit lines B and $\overline{B}$, respectively. In this manner, the transistors Q1 to Q4 constitute a flip-flop circuit. The transistor Q5 includes a source and a drain connected respectively, to bit lines B and $\overline{B}$; whereas, a gate thereof is coupled with a signal line φP of a precharge signal φP. The transistors Q6 and Q7 possess drains commonly connected to a power source at a level of ½ VCC. Sources of Q6 and Q7 are linked respectively with bit lines B and $\overline{B}$, and gates thereof are coupled with the signal line φP. The memory cell includes a transistor Q8 and a capacitor C1. A drain of the transistor Q8 is connected to the bit line B, a gate thereof is linked with a word line W corresponding to an output w from the row decoder, and a source thereof is coupled with the capacitor C1 of which another end is connected to a power source at a level of ½ VCC.

The signal φa1 and φa are in an in-phase state. When the signal φa is at a high level in an active state, the signal φa1 is at a high level. When the signal φa is at a low level, the signal φa1 is at a level of ½ VCC. Furthermore, when the signal φa is at a high level and a low level, the opposite-phase signal $\overline{\phi a1}$ is respectively at a ground level and at a level of ½ VCC.

The sense amplifier 2 is responsive to activation of the signal φa such that the signals φa1 and $\overline{\phi a1}$ are set respectively to a high level and a low level and hence the amplifier 2 functions as a cache memory keeping data in a flip-flop circuit including the transistors Q1 to Q4.

In the semiconductor memory device of this construction, when an X address specified for a memory access is associated with a row address (cache address) kept in the sense amplifier 2, namely, when a cache hit takes place, the sense amplifier 2 is selected by a Y address without activating the row controller 7 so that the data input or output operation can be accomplished at a high speed.

Next, referring also to the signal timing chart shown in FIG. 3, description will be given of an operation in which the memory access is related to a row address different from the cache address, namely, an operation in the case of a cache miss. When the inverted row control signal $\overline{R}$ set to a low level, the signal S1 is activated or asserted. As a result, the signals φp and φa are set to a high level and a low level, respectively. Accordingly, the transistors Q5 to Q7 become conductive and the bit lines B and $\overline{B}$ are electrically equalized to a potential level of ½ Vcc. In this situation, the X decoder output is kept remained at a low level. Furthermore, since the signal φa is at a low level, the signals φa1 and $\overline{\phi a1}$ are at ½ Vcc. The high-level period of φp continues for a short period of time as a precharge period, which will be described later.

Subsequently, the signal φp is altered to a low level, i.e., a non-active state to activate the word signal w outputted from the row decoder 3. Additionally, the potential ½ Vcc of bit lines B and $\overline{B}$ set to a floating state. Thereafter, the signals φa1 and $\overline{\phi a}$ are changed to a low level and high level, respectively. As a result, the transistor Q8 at the row address thus selected by the row decoder 3 becomes conductive such that a potential corresponding to the quantity of charge of the capacity C1 is outputted to the bit line B. The delivered cell data is then amplified by the sense amplifier 2 to be kept therein as cache data.

This state is kept retained until a memory access is issued for another row address. Thanks to the cache memory system described above, when a requested memory access is associated with the cache data, the access operation is carried out directly from the sense amplifier without executing the read/write operation of the memory cell array 1, which therefore results in a high-speed memory access.

In addition, when the memory access is issued for an address different from the row address of cache data, the cache data can be easily replaced.

Since the memory is generally accessed in a localized fashion in many cases, most memory access operations are executed for cache data and hence the memory access speed is increased.

Referring now to FIG. 4 showing in a circuit diagram the construction of the timing signal generator 71 to produce signals φp and φa, the generator circuit 71 includes a flip-flop circuit F71 including NAND logic gates (NANDs) G71 and G72 and generating the signal φp, an inverter logic gate (to be simply referred to as an inverter) G73 for inverting the signal φp to produce the signal φa, an inverter G74 for inverting an input signal S1 to supply the inverted signal to the NAND G71, a delay circuit DL71 for delaying the signal S1 for a fixed delay period equivalent to the precharge period to thereby create a delay signal D, and an inverter G75 for inverting the delay signal D to deliver the inverted signal to the NAND G72.

Referring again to FIG. 3, description will be given of operation of the timing signal generator 71. When the inverted row control signal $\overline{R}$ is activated to a low level, there is generated a signal S1 which is a pulsated signal having a fixed pulse width (to be referred to as a one-shot signal herebelow). The flip-flop circuit F71 including NANDs G71 and G72 is set by the signal S1 and then reset by the delay signal D obtained by delaying the signal S1 for a predetermined period of delay time. Resultantly, there are attained the desired signals φp and φa.

In general, a large-capacity semiconductor memory device of this type includes dynamic memory cells and is therefore required to be refreshed at a fixed interval of time. However, when the refresh operation is employed in the semiconductor memory device including the cache keeping means, the refresh operation is achieved in almost completely the same way as for the ordinary memory access excepting that the specified row address varies therebetween. In consequence, after the memory is refreshed, data of the refresh row address is kept as cache data. However, the row address is independent of the memory access and hence probability of cache miss will be increased when accessing the memory thereafter. In consequence, each time an attempt is made to access the memory thus refreshed, there is again conducted the memory access procedure beginning at the precharge period, which is employed on a cache miss.

In the conventional semiconductor memory device of this kind, data of the previous cycle is kept as cache data in the sense amplifier to improve the probability of the cache hit, leading to a high-speed access. However, after the memory is refreshed, the cache data is replaced with data corresponding to the refresh address and hence the probability of cache miss is increased in the succeeding memory access. Moreover, the memory access is executed beginning at the precharge period in any case, the access time is disadvantageously elongated.

SUMMARY OF THE INVENTION

It is therefore an object of the present invention to provide a semiconductor memory device capable of removing the drawback described above.

In accrordance with the present invention, there is provided a semiconductor memory device comprising a memory cell array in which memory cells to store information therein are arranged along rows and columns and in which an input/output operation of the informaiton is conducted by specifying a row address and a column address, a sense amplifiers for keeping therein information of one-row memory cells of a row corresponding to a beforehand specified row address, the information being kept as cache data, and precharge control means. The memory device achieves, when an external row address externally specified matches the selection row address, a read or write operation of the cache data in the sense amplifier and accomplishing a periodic refresh operation. The precharge control means completes, during a period of the refresh operation cycle, a predetermined precharge operation for the sense amplifier and bit lines corresponding thereto for the subsequent memory access.

BRIEF DESCRIPTION OF THE DRAWINGS

The objects and features of the present invention will become more apparent from the consideration of the following detailed description taken in conjunction with the accompanying drawings in which.

DESCRIPTION OF THE PREFERRED EMBODIMENTS

Figure 1:
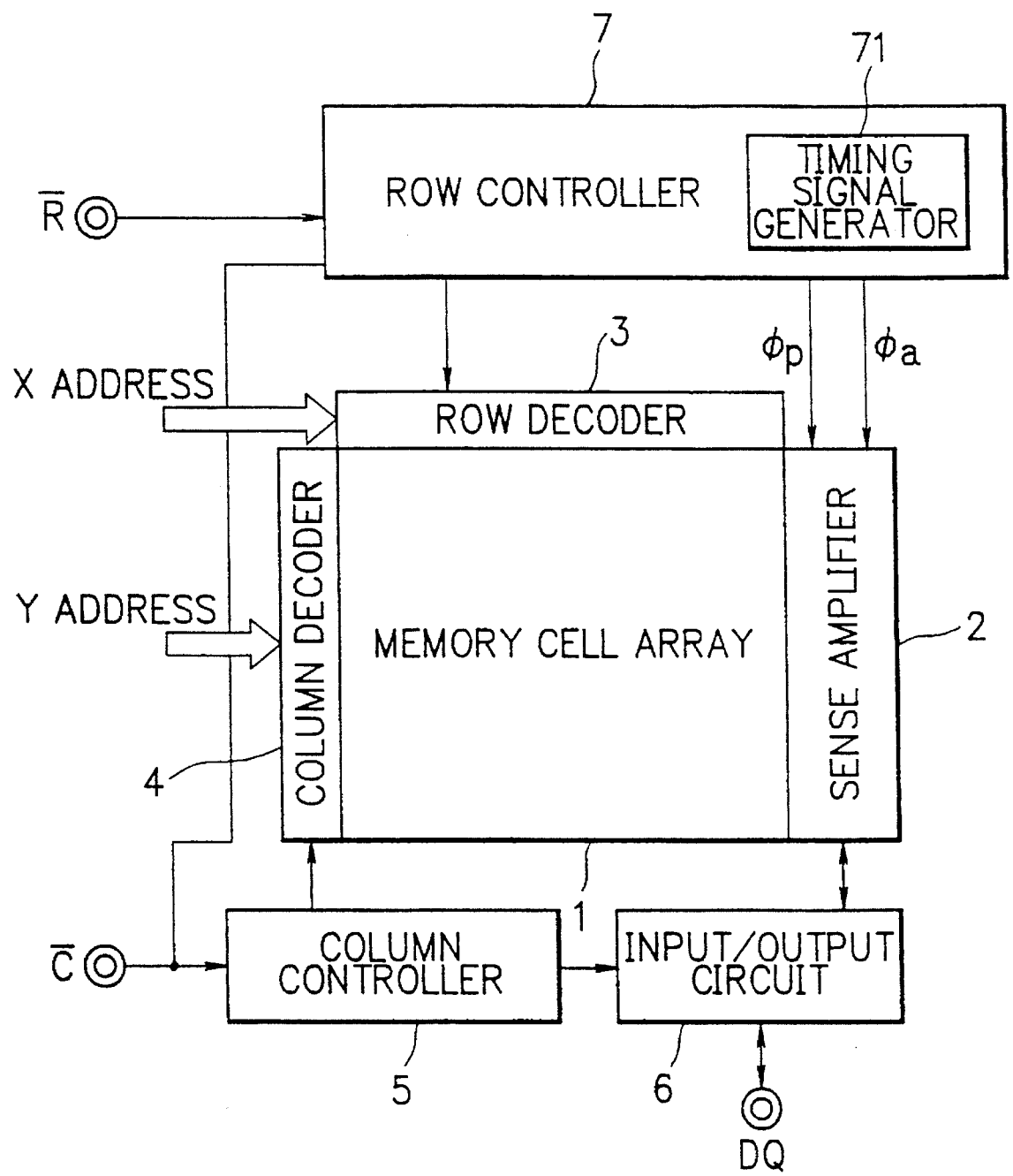
FIG. 1 is a block circuit diagram showing an example of a conventional semiconductor memory device.
Figure 2:
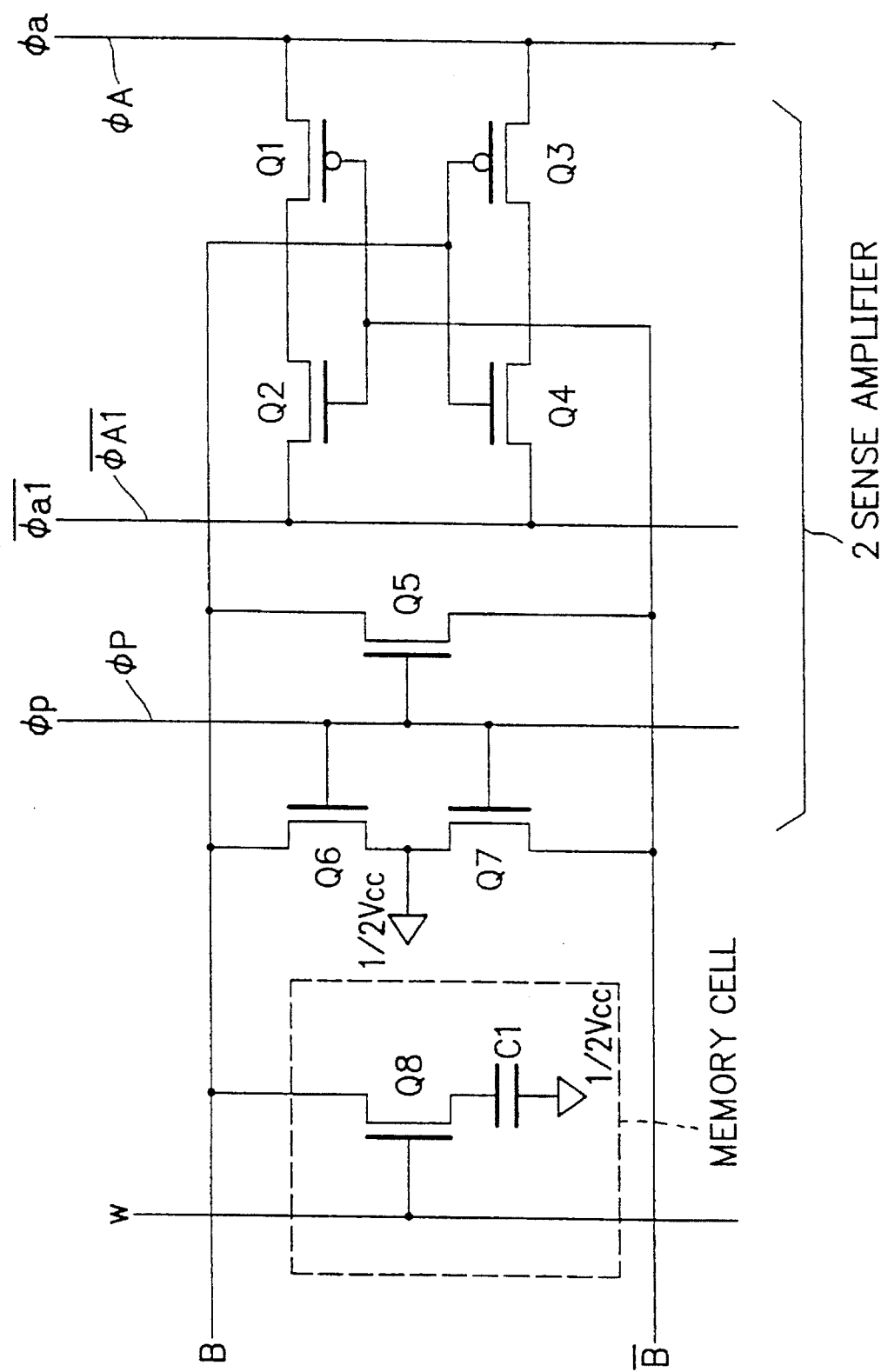
FIG. 2 is a circuit diagram showing a relationship between a sense amplifier and a memory cell in a general semiconductor memory device.
Figure 3:
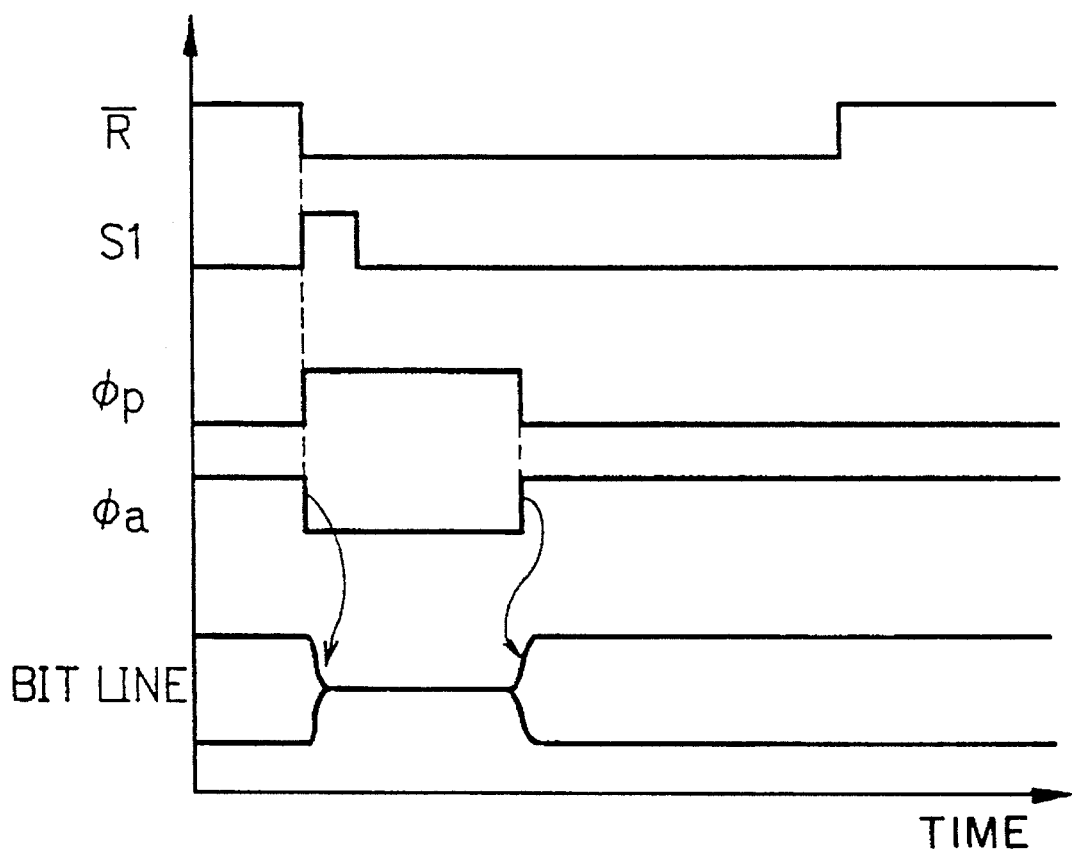
FIG. 3 is a signal timing chart showing operation of the conventional semiconductor memory device.
Figure 4:
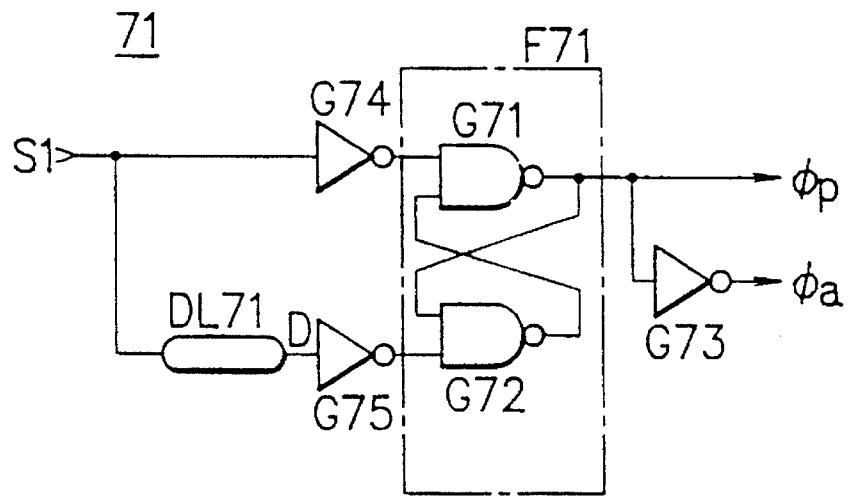
FIG. 4 is a circuit daigram showing an example of a timing signal generator.
Figure 5:
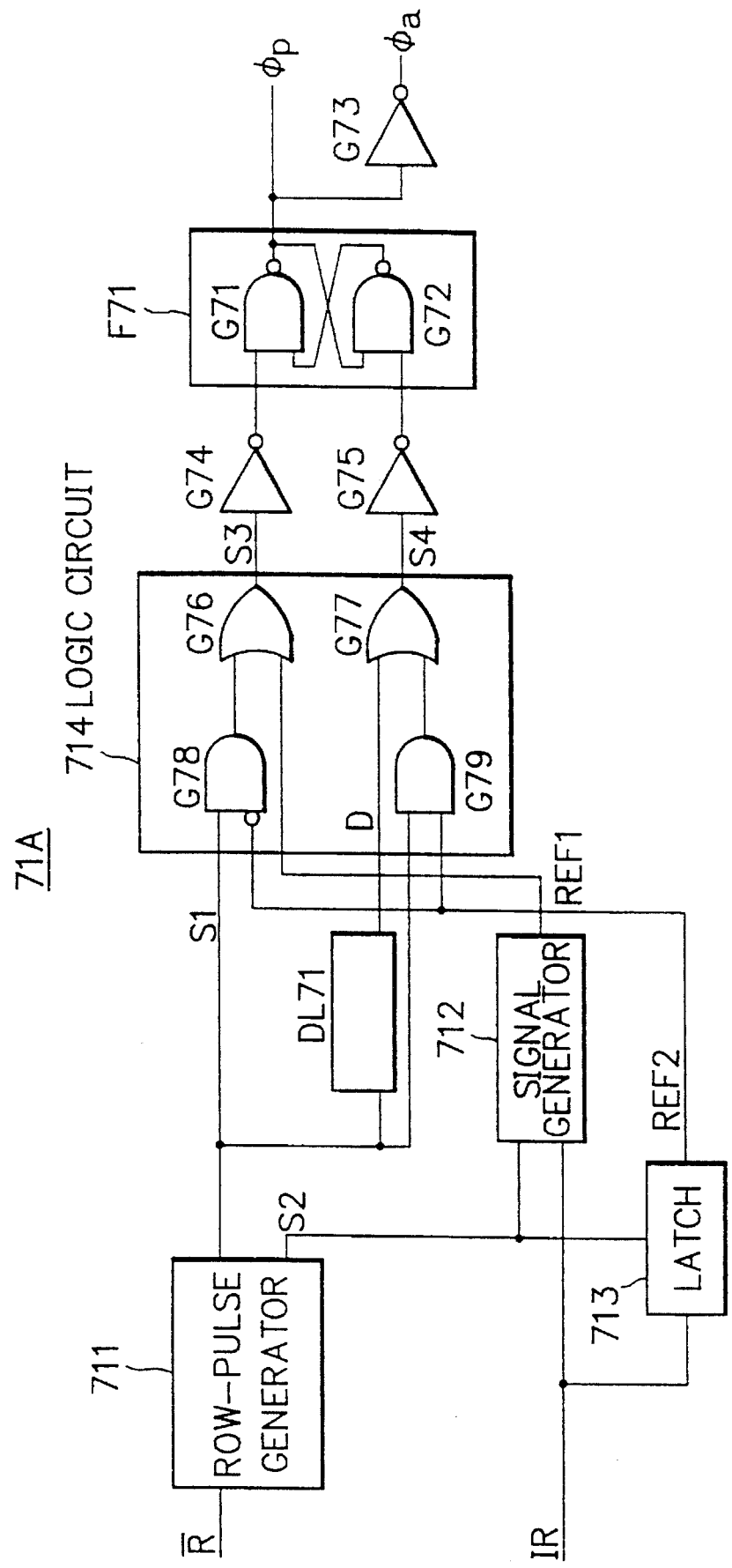
FIG. 5 is a circuit diagram showing a timing signal generator in an embodiment of a semiconductor memory device according to the present invention.

Referring now to FIG. 5 showing a timing signal generator 71A according to an aspect of an embodiment of the present invention in which the same constituent components as those of FIG. 4 are assigned with the same reference letters or numbers, the generator circuit 71A includes, in addition to a flip-flop circuit F71 including NANDs G71 and G72, inverters G73 to G75, a delay circuit DL71, which are also used in FIG. 4; a row pulse generator 711 for generating a signal S2 in response to transition of a signal S1 to a high level caused by transition of the inverted row control signal $\overline{R}$, a signal generator 712 for generating a signal REF1 in response to reception of a refresh signal IR and the signal S2, a latch circuit 713 for storing therein the refresh signal IR according to the signal S2 and generating a signal REF2, and a logic circuit 714 responsive to reception of signals S1, D, REF1, and REF2 for conducting a predetermined logic operation and producing signals S3 and S4.

The logic circuit 714 includes an AND logic gate (AND) G78 for conducting an AND operation between the signal S1 and a signal obtained by inverting the signal REF2, an OR logic gate (OR) G76 for conducting an OR operation between the output from the AND G78 and the signal REF1 to thereby produce a signal S3, an AND gate G79 for achieving an AND operation between the signals S1 and REF1, and OR gate G77 for accomplishing an OR operation between the output from the AND G79 and the delay signal D so as to create a siganl S4.

Figure 6:
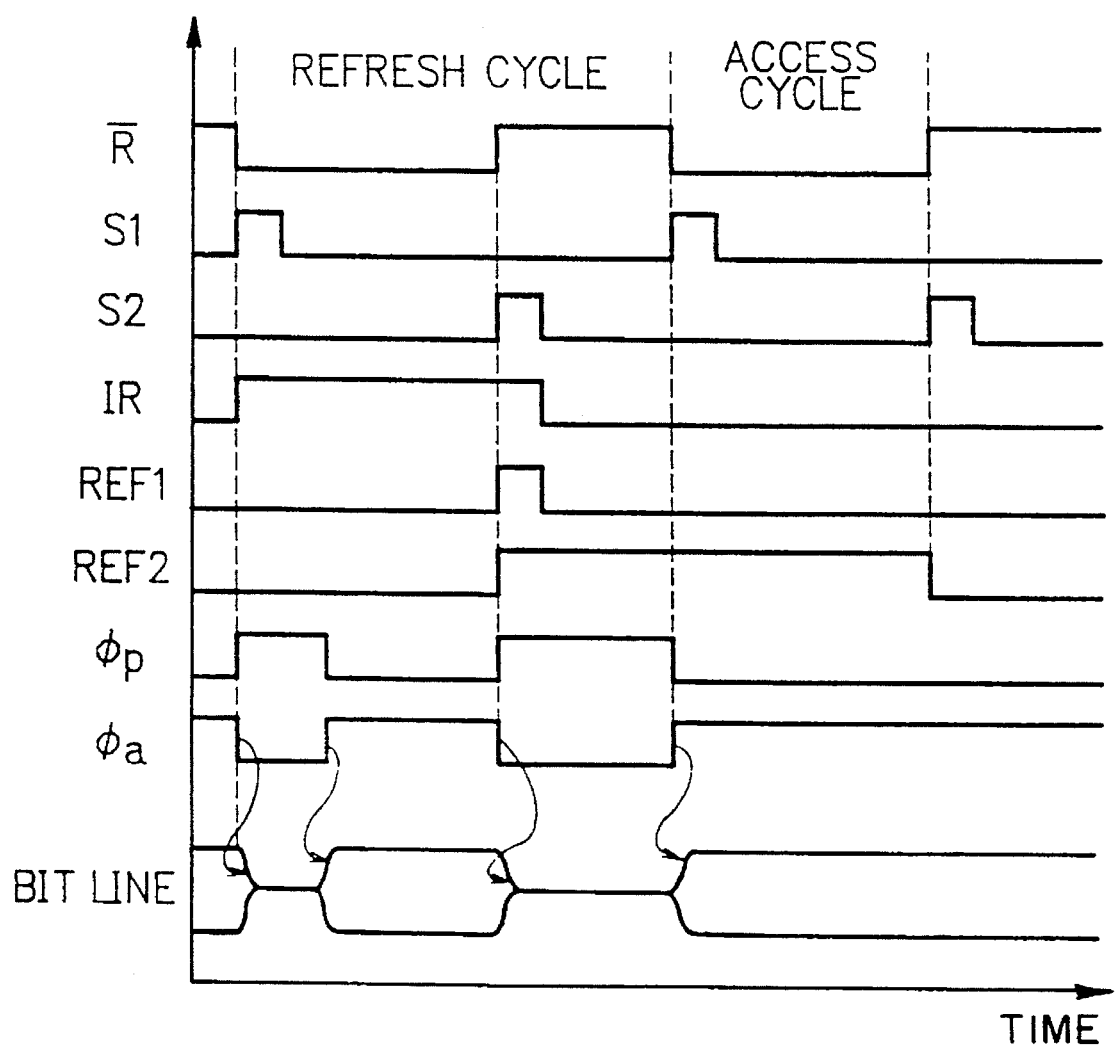
FIG. 6 is a signal timing chart showing operation of the embodiment.

Operation of the embodiment will be next described by referring to FIG. 5 and the signal timing chart of FIG. 6. In the timing chart, the first cycle is a refresh cycle in which the row pulse generator 711 generates a high-level one-shot signal S1 when the inverted row control signal $\overline{R}$ set to a low level. Resultantly, as described in conjunction with the prior art, the signals φp and φa are changed respectively to a high level and a low level to start the precharge period in which the bit lines B and $\overline{B}$ are equalized to a predetermined potential. On the other hand, the signal generator 712 basically includes an AND gate for producing a logical product between the signals IR and S2. At the starting point of the precharge period, although the refresh signal IR, which is set to a high level during the refresh cycle, is at a high level, since the signal S2 is not being created from the row pulse generator 711, the signal REF1 produces the signal generator 712 at a low level. Additionally, the latch circuit 713 is not supplied with the signal S2 and hence creates the output signal REF2 at a low level. Next, the signal S1 is supplied to the logic circuit 714 as a delay signal D when the period of delay time of the delay circuit DL71 lapses thereafter. In the logic circuit 714, the signal D is fed as a signal S4 via the OR G77 to the inverter G75 to reset the output signal φp from the flip-flop circuit F71 to a low level in the same fashion as for the conventional system, thereby terminating the precharge period. At the same time, the signal φa is set to a high level to accomplish the data input/output operation and data amplification by the sense amplifier on a bit line corresponding to the refresh address.

Subsequently, when the inverted row control signal $\overline{R}$ is set to a high level, i.e., a deactivated state, the signal REF1 from the signal generator 712 is set to a high level since the signal IR is still kept remained at a high level. As a result, the output S3 from the OR G76 of the logic circuit 714 is changed to a high level to set the flip-flop circuit F71, which activates the signal φp to a high level.

In addition, the row pulse generator 711 generates a signal S2 in response to increase in the potential of the signal $\overline{R}$ and then delivers the signal S2 to the latch circuit 713. At this point of time, the latch circuit 713 stores therein the high-level signal IR in response to the signal S2. The latch circuit 713 then sets the output signal REF2 to a high level and keeps the high-level state. As a result, the logic circuit 714 sets the output signal S3 to a high level and then again sets the signal φp to a high level. Since the signal φp becomes a high level, the bit lines B and $\overline{B}$ are again precharged. This state is kept retained until the signal $\overline{R}$ is decreased to a low level.

When signal $\overline{R}$ is set to a low level in the next access cycle, there is generated a signal S1. However, since the latch circuit 713 keeps the signal REF2 at the high level, the signals S3 and S4 from the logic circuit 714 are changed respectively to a low level and a high level. Consequently, the signal φp is reset to a low level, i.e., a non-active state and the signal φa is simultaneously activated to a high level, thereby executing the operation of the sense amplifier. Namely, when the level of the signal $\overline{R}$ is lowered, the operation of the sense amplifier is immediately accomplished. Consequently, when compared with a case in which the operation is initiated in the cycle beginning at the precharge period, the period of time required for the access is decreased by a period of the precharge time. When the signal $\overline{R}$ is in a non-active state, the signal REF2 is set to a low level, namely, the initial state is restored.

As described above, according to the semiconductor memory device of the present invention, there is provided precharge means for completely achieving a predetermined precharge operation during a refresh operation cycle for a sense amplifier and bit lines corresponding thereto for a subsequent memory access. With this provision, irrespective of a memory access after an execution of a memory refresh operation, data having lower significance is cleared immediately after the memory refresh operation and the associated bit lines are precharged, which minimizes the period of access time by a period of time equivalent to the precharge period in the next access cycle.

While the present invention has been described with reference to the particular illustrative embodiments, it is not to be restricted by those embodiments but only by the appended claims. It is to be appreciated that those skilled in the art can change or modify the embodiments without departing from the scope and spirit of the present invention.

What is claimed is:

1. A semiconductor memory device comprising:

a memory cell array in which memory cells to store information therein are arranged along rows and columns and in which an input/output operation of the information is conducted by specifying a row address and a column address;

a sense amplifiers for keeping therein information of one-row memory cells of a row corresponding to a beforehand specified row address, the information being kept as cache data; and precharge control means;

the memory device achieving, when an external row address externally specified matches the selection row address, a read or write operation of the cache data in the sense amplifier and accomplishing a periodic refresh operation;

the precharge control means completing, during a period of the refresh operation cycle, a predetermined precharge operation for the sense amplifier and bit lines corresponding thereto for the subsequent memory access.

2. A semiconductor memory device as claimed in claim 1, wherein the precharge control means includes;

timing pulse generating circuit means for generating a first timing signal and a second timing signal at timing respectively synchronized with a leading edge of activation and a leading edge of deactivation of a row control signal for selection of the row address and for activation of the sense amplifier;

delay circuit means for delaying the first timing signal for a predetermined period of time and thereby producing a delay signal;

control signal generating circuit means for generating a first precharge control signal in response to reception of a refresh control signal activated during the period of refresh operation and the second timing pulse;

latch circuit means for storing therein the refresh control signal according to the second timing signal and thereby producing a seconed precharge control signal;

logic circuit means for receiving the first timing signal, the first and second precharge signals, and delay signal, conducting a predetermined logic operation, and thereby producing a third timing signal and a fourth timing signal; and precharge signal generating circuit means responsive to reception of each of the third and fourth timing signals for generating and stopping the precharge signals controlling the precharge operation.

* * * * *